United States Patent [19]

Blackburn

[11] Patent Number: 4,812,888
[45] Date of Patent: Mar. 14, 1989

[54] SUSPENDED GATE FIELD EFFECT SEMICONDUCTOR PRESSURE TRANSDUCER DEVICE

[75] Inventor: Gary F. Blackburn, Ithaca, N.Y.

[73] Assignee: Cornell Research Foundation, Inc., Ithaca, N.Y.

[21] Appl. No.: 35,519

[22] Filed: Apr. 7, 1987

Related U.S. Application Data

[63] Continuation of Ser. No. 668,444, Nov. 11, 1984, abandoned.

[51] Int. Cl.$^4$ .................... H01L 29/84; H01L 29/96
[52] U.S. Cl. .................................... 357/26; 357/23.15
[58] Field of Search ............... 357/26, 23.15; 73/777, 73/718, 715, 754

[56] References Cited

U.S. PATENT DOCUMENTS

| | | | |
|---|---|---|---|
| 2,899,344 | 8/1959 | Atalla et al. | 357/52 X |
| 3,440,873 | 4/1969 | Eichelberger | 357/26 X |
| 3,445,596 | 5/1969 | Drake et al. | 357/26 X |
| 3,585,415 | 6/1971 | Muller | 357/23.15 X |
| 4,035,822 | 7/1977 | Vilkomerson | 357/26 |

OTHER PUBLICATIONS

J. M. Borky and K. D. Wise, IEEE Trans. El. Dev. ED-26, 1906, (1979).
S. K. Clark and K. D. Wise, IEEE Trans. El. Dev. ED-26, 1887, (1979).
W. H. Ko, M. Bao and Y. Hong, IEEE Trans. El. Dev. Ed-29, 49, (1982).
Y. S. Lee and K. D. Wise, IEEE Trans. El. Dev. Ed-29, 42, (1982).
Y. L. Lee and K. D. Wise, IEEE Trans. El. Dev., ED-29, 33, (1982).

Primary Examiner—Andrew J. James
Assistant Examiner—Sara W. Crane
Attorney, Agent, or Firm—Ralph R. Barnard

[57] ABSTRACT

A capacitive pressure transducer comprising:
field effect solid state electronic device having a semiconductor gate area, an insulating layer and a gate element;
the gate element being made of conducting material and being constructed to move in response to pressure differentials on the two sides thereof so as to function as a diaphragm;
the gate element being hermetically sealed along its perimeter with the said insulating layer;
the gate element also being a conductor so as to change the capacitance between the said gate element and the semiconductor of said field effect solid state device and cause any change in the output of said solid state electronic device to be a measure of the change of the pressure;
and a method of making the suspended diaphragm and gate element.

5 Claims, 2 Drawing Sheets

SUSPENDED GATE FIELD EFFECT SEMICONDUCTOR PRESSURE TRANSDUCER DEVICE

This invention is a subject invention of a National Science Foundation Grant No. 8200312.

This is a continuation of application Ser. No. 668,444, filed Nov. 11, 1984, now abandoned.

The invention relates to a new and improved pressure transducer using a suspended gate field effect semiconductor device, and to new and improved methods of fabricating a pressure transducer and at the same time utilizing methods commonly employed in integrated circuit fabrication facilities using silicon, gallium arsenide and other compounds.

During the past several years interest in the development of solid-state pressure sensors has increased dramatically. The following scientific articles depict the significant interest in the subject matter:
1. J. M. Borky and D. D. Wise, *IEEE Trans. El. Dev.*, ED-26, 1906, (1979);
2. S. K. Clark and D. D. Wise, *IEEE Trans. El. Dev.*, ED-26, 1887 (1979);
3. C. C. Fung and W. H. Ko, *Sens. Actuators*, 2, 321 (1982);
4. W. H. Ko, M. Bao. and Y. Hong, *IEEE Trans. El. Dev.*, ED-29, 49 (1982);
5. Y. S. Lee and K. D. Wise, *IEEE Trans. El. Dev.*, ED-29, 42 (1982)
6. Y. L. Lee and K. D. Wise, *IEEE Trans. El. Dev.*, ED-29, 33 (1982).

The devices have wide spread application primarily in the areas of industrial process control, automobile engine monitoring, and biomedicine. Two types of silicon pressure sensors have emerged: piezoresistive and capacitive. Both types utilize a thin silicon diaphragm which is fabricated by the anisotropic etching of a thicker silicon substrate. Changes in the pressure on one side of the diaphragm result in a measureable flexure, the magnitude of which is usually proportional to the applied pressure. The piezoresistive sensor relies on stress-induced changes in the resistivity of diffused resistors in the diaphragm. The capacitive sensor relies on changes in the capacitance between the diaphragm and a metallized plate which is placed parallel to and very close to the silicon diaphragm. Both types of sensors require that the silicon chip be attached to a support plate to hermetically seal the chamber on one side of the diaphragm.

While the development of these sensors has been relatively successful, several problems hamper their widespread acceptance. The technique for the anisotropic selective etching of the silicon to form the thin diaphragm has seen considerable improvement recently but is still not a high-yield process. In addition, the complexity of the sensors is considerably increased by their requirement to be hermetically sealed to a support plate. The seal is formed either by electrostatic bonding or by alloying to a thick support material. The process is generally quite reliable but is performed on an individual chip basis rather than as a whole wafer so the cost and effort per sensor is rather high. In addition, the capacitive sensors, which demonstrate a much higher sensitivity than the piezoresistive type, suffer from the fact that the magnitude of the capacitance change is very small. Thus, on-chip circuitry is required for signal detection since the signal would be lost in parasitic capacitance if it was brought out to external circuitry through wires. These problems with the present miniature silicon pressure sensors have slowed their acceptance as low cost, reliable, and sensitive pressure transducers.

This invention, in one of its embodiments, teaches a new and improved type of capacitive pressure sensor which utilizes a field-effect transistor (FET) to sense the flexure of a conductive diaphragm suspended above the transistor. The conductive diaphragm also functions as the gate element of the field effect semiconductor device. the diaphragm is fabricated *above* the surface of the semiconductor material such as silicon so that it is possible to place it *over* the sensing element (the FET) in the semiconductor.

This invention also teaches a novel method for fabricating the suspended diaphragm which also functions as the gate element of the field effect semiconductor device useable as a capacitative pressure transducer. The teachings of the invention include the techniques where plural suspended gate field effect semiconductor devices can be manufactured on each and all, or part of the plural chips to be made from the starting wafer, while the plural chips are still in wafer form. Because the suspended diaphragm and gate element is manufactured while the plural chips remain in wafer form, the yield of the manufacturing process against faulty components is not adversely impacted and the hermetic sealing of the diaphram and the insulating layer is enhanced and simplified.

As the manufacturing proceeds, each chip, containing a suspended gate field effect semiconductor pressure transducer device, may have additional components and circuitry added. Because the pressure sensing diaphragm is integral with the field effect semiconductor device, the variation of capacitance, an indication of pressure change, is reflected in the electrical output of the semiconductor device and the pressure transducer is not subject to stray capacitance noise, nor does it suffer from the fact that the Accordingly it is the object of the present invention to provide a new and improved capacitive pressure transducer which is made integral in a field effect solid state electronic device wherein the gate element of the field effect solid state electronic device is also suspended above the insulating layer thereof and functions as a diaphragm wherein the deflection of the diaphragm is a measure of pressure to be measured capacitively by the output of said electronic device.

Accordingly it is another object of the present invention to provide a new and improved capacitive pressure transducer using solid state electronic technology.

It is still another object of the present invention to provide a new and improved fabrication method and technique for fabricating pressure transducers which is realiable, of low cost and has a high yield.

It is still another object of the present invention to provide a new and improved fabrication method and technique for fabricating pressure transducers which is adaptable to wafer level production rather than on an individual chip basis.

It is still another object of the present invention to provide a new and improved pressure transducer wherein capacitive changes resulting from pressure changes being measured are not lost in parasitic capacitance of external circuitry as a signal is brought away from the chip.

Still another object of the present invention will be described hereinafter including all the embodiments, as well as the applicability of the invention to semiconductor material in gate controlled field effect devices of a wide range of types, including silicon and gallium arsenide and other compounds.

Figure 1A:
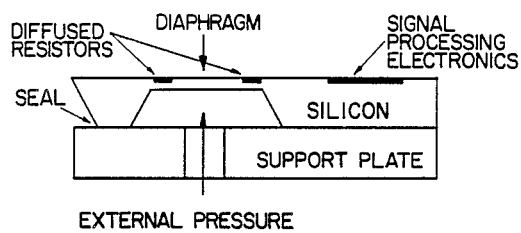
FIG. 1A shows a piezoresistive sensor made from etching silicon material in accordance with the prior art.

Reference to FIG. 1A, the thin silicon diaphragm, is fabricated by the anisotropic etching of a thicker silicon substrate. The silicon diaphragm must be be attached to the support plate to hermetically seal the chamber on one side of the diaphragm. The seal is formed either by electrostatic bonding or by alloying to the thick support material. Changes in the pressure on one side of the diaphragm result in measurable flexure, the magnitude of which is usually proportional to the applied pressure. The piezoresistive sensor relies on stress-induced changes in the resistivity of diffused resistors in the diaphragm. The diffused resistors are connected with signal processing electronics on the chips to measure the change in resistance as a measure of the pressure changes.

Figure 1B:
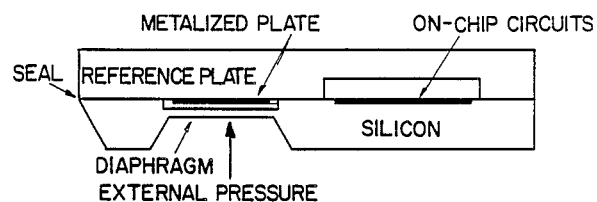
FIG. 1B shows a capacitive sensor made from etching silicon material in accordance with the prior art.

Turning to FIG. 1B, the thin silicon diaphragm is also fabricated by anisotropic etchings of a thicker silicon substrate and has a metallized plate layed down thereon, using conventional techniques which is placed parallel and very close to the silicon diaphragm. The capacitive sensor relies on changes in the capacitance between the diaphragm and the metalized plate. This sensor also requires that the silicon diaphragm be attached to a support plate to hermetically seal the chamber on one side of the diaphragm. The variation in capacitance is measured by signal processing electronics also placed on the chip.

While the sensors of FIG. 1A and FIG. 1B have been relatively successful, several problems hamper their widespread acceptance. The technique for the anisotropic selective etching of the silicon to form the thin diaphragm has seen considerable improvement recently but is still not a high-yield process. In addition, the complexity of the sensors is considerably increased by their requirement to be hermetically sealed to a support plate. the seal is formed either by electrostatic bonding or by alloying to a thick support material. The process is generally quite reliable but is performed on an individual chip basis rather than as a whole wafer so the cost and effort per sensor is rather high. In addition, the capacitive sensors, which demonstrate a much higher sensitivity than the piezoresistive type, suffer from the fact that the magnitude of the capacitance change is very small. Thus, on-chip circuitry is required for signal detection since the signal would be lost in parasitic capacitance if it was brought out to external circuitry through wires. These problems with the present miniature silicon pressure sensors have slowed their acceptance as low cost, reliable, and sensitive pressure transducers.

Figure 2:
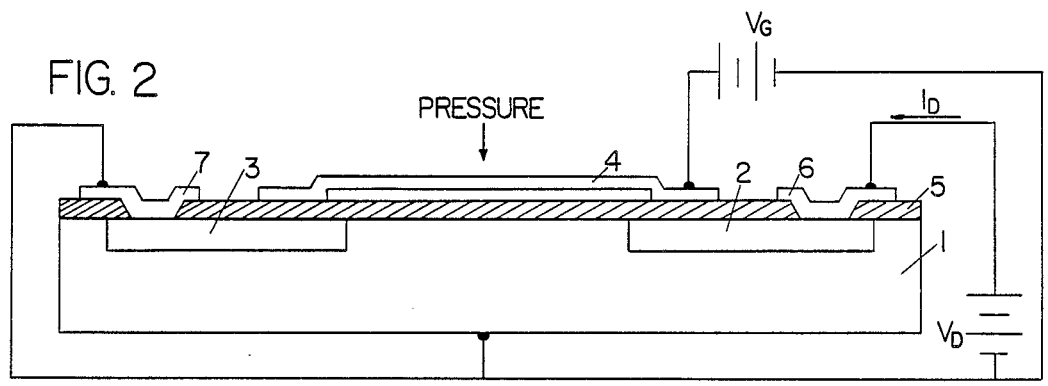
FIG. 2 shows a suspended conductive gate MOS field effect transistor pressure transducer constructed in accordance with the present invention.

FIG. 2 shows a suspended gate MOS field effect transistor constructed in accordance with the invention on one chip wherein the suspended gate may be fabricated while the chip is still a part of the larger wafer where a plurality of MOS field effect transistors are fabricated simultaneously. The suspended gate FET pressure transducer of FIG. 2 is shown to consist of a standard n-channel field effect transistor, except that the gate element 4 is also a diaphragm raised above the insulating layer 5 forming a hermetically sealed chamber in the gate region bridging across and above the insulating layer from above the n-type drain to above the n-type source (the gate length). By way of example, the gate length could be designed to be approximately 0.5um and the gate width could be approximately 5um. The maximum size of the FET is limited by the maximum size of the suspended diaphragm and gate element which can be fabricated as a free standing structure. Diaphragms as large as 10um square have been made and there is no logical reason why structures 50um square and larger could not be fabricated. FIG. 4 describes one way to fabricate the suspended diaphragm and gate element in a new and improved manner in accordance with the teachings of this invention. Other methods might well be used, but the cost and yield in production of such a suspended combined diaphragm and gate element must fit into the high production technology inherent for semiconductors in the industry.

In addition to the suspended conductive diaphragm 4 and insulating layer 5, FIG. 2 also shows p-type silicon substrate 1, n-type drain 2, n-type source 3, contact metallization to the drain 6 and contact metallization to the source 7. For simplification of the drawing, FIG. 2 is not to scale. For example, the p-type silicon substrate is in fact thicker than shown and the n-type drain 2 and n-type sources are much wider than shown. These scale differences are obvious to those skilled in the art. Pursuant to the teachings of the present invention it should be recognized, that the suspended conductive diaphragm 4 should have substantially more area than the gate (length times width) because the flexure of the diaphragm toward its center will be greater in response to differential pressure changes.

If during the fabrication process of the plural FET's on the wafer, the conventional gate material has also already been deposited for each transistor, that gate metal can be used as a self alignment aid, and then removed by chemical etching. Thereafter the suspended diaphragm over the FET is fabricated from any conductive material with the proper mechanical properties. The gate voltage $V_g$ is applied to this diaphragm and the drain voltage Vd is applied to the drain of the FET. Other connections are made as shown in FIG. 2.

The drain current, Id, for an n-channel FET such as shown in FIG. 2 is given by the equations 6:

$$Id = (\mu_n WCins/L)[Vg - Vt - VD/2]Vd \text{ for } Vd > Vg - Vt$$

$$ID = (\mu_n WCins/L)[Vg - Vt]2 \text{ for } Vd < Vg - Vt$$

where $\mu_n$ is the mobility of electrons in the channel, W and L are the gate width and length, respectively, and Vt is the threshold gate voltage, Cins is the capacitance per unit area of the insulator and between the gate and the silicon. For the device shown in FIG. 2, Cins is the series combination of the capacitance of the SiO2 insulator and the gap between the diaphragm and the SiO2. According to the equations, the drain current is proportional to this capacitance. Any change in the pressure external to the sensor will result in flexure of the diaphragm if it is hermetically sealed around its perimeter. Movement of the diaphragm causes a change in the gate capacitance which will result in a change in the drain current. Therefore, the external pressure can be monitored by measuring the drain current of the transistor.

It is of course not necessary for the change in drain current Id to be proportional to the change of capacitance or the change in pressure being measured as long as such relationship is a known function because the signal processing electronics in the output (not shown) can take that known nonlinearity into account.

While in FIG. 2 the invention is shown as the integration of the suspended conductive diaphragm with the MOS type n-channel field effect transistor, it should be noted that non n-channel field effect transistor not using metal oxide on silicon may be used in practicing the present invention. Also, an MOS p-channel FET could alternatively be used.

Figure 3:
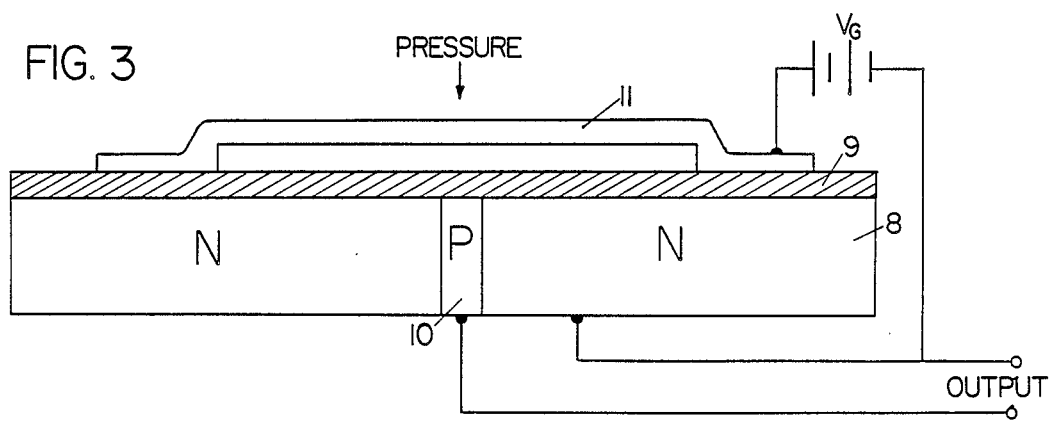
FIG. 3 shows a suspended conductive gate controlled field effect diode pressure transducer constructed in accordance with the present invention.

FIG. 3 shows the teachings of the present invention being used to modify a gate controlled field effect diode so that it has a suspended conductive gate also functioning as a flexible diaphragm which can be used to measure changes in pressure. In FIG. 3, the field effect diode comprises an n-type silicon substrate 8, the insulating layer 9 is silicon oxide SiO2, the diode element 10 is p-type silicon and the suspended metalized gate and diaphragm 11 flexes in response to pressure changes to alter the capacitance at the output Cj (the capacitance between the n-type silicon 8 and the p-type silicon 10). Movement of the metalized gate diaphragm results in changes in Cins. For a selected and constant voltage applied to the metalized gate, Vg, the capacitance in the output Cj will be roughly linear with changes in the total capacitance Cins of the insulating layer 9 and the changed sealed gap between the diaphragm 11 and the insulating layer 9. The constant gate voltage Vg should be selected to be in a range value such that the insulation capacitance Cins would change significantly with small changes in the gate voltage Vg. The teachings set forth hereinabove concerning the fabrication of the suspended metalized gate diaphragm for a plurality of devices while the substrate material is still in wafer form, apply for the diode of FIG. 3 in the same manner as it applied to the transistor of FIG. 2.

Figure 4A:
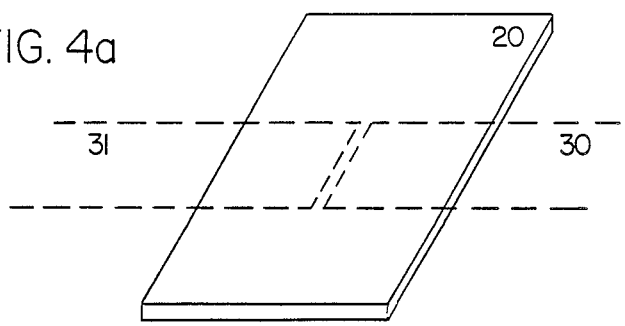
FIGS. 4a, 4b, 4c and 4d illustrate the fabrication method of the present invention as it relates to the laying down of the suspended diaphragm and gate material as it relates to a single semiconductor chip which may be part of a larger wafer containing other silicon chips.
Figure 4B:
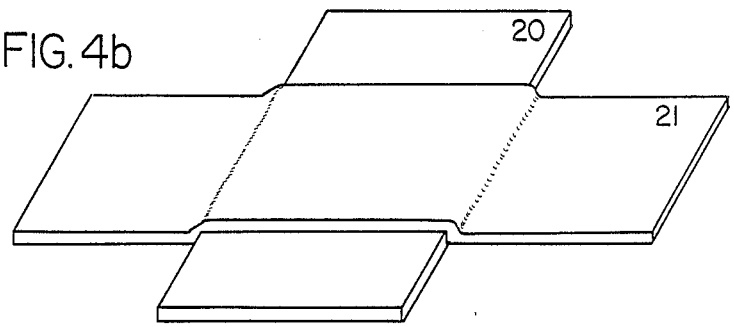
Figure 4C:
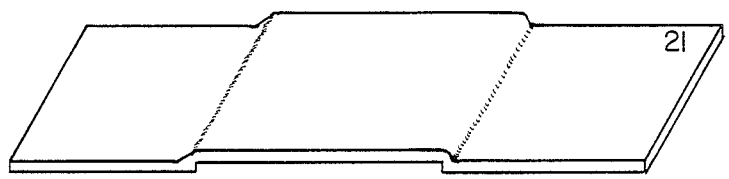

The suspended gate FET pressure transducer is fabricated using methods commonly employed in silicon integrated circuit fabrication facilities. The underlying FET is fabricated by any of several commonly employed methods. If a non suspended gate normally associated and appropriately located for a FET gate is employed for self-alignment purposes, it must be removed by selective etching before the suspended metallized gate and diaphragm is fabricated. To form the diaphragm a selectively soluble material 20 is patterned over the FET as shown in FIG. 4a. A second layer of a conductive material 21 is then applied and patterned over the first material as shown in FIG. 4b. The drain 30 and source 31 are not shown in FIGS. 4b, 4c and 4d for simplicity of view. The diaphragm is left suspended by wet etching the first material 20 from underneath the second material as shown in FIG. 4c. Because the second material 21 is on top of the first material 20, the etching must be done from the side and time must be allotted for complete lateral etching.

The requirements for the two materials are simply that the first material 20 can be selectively etched without affecting the second material 21. Polymers or metals are likely candidates for the first material. The second material should be a conductor such as aluminum and be more etch resistant than the first material 20. Metals, conductive polymers, semiconductors, or a layered structure of a polymer on top of a metal are possible alternatives for the second material 21.

As a practical matter the first material is laid across the whole wafer and is selectively removed from all areas except the plural rectangular shapes 20 across each gate area of each field semiconductor device being manufactured in the wafer where a suspended diaphragm is desired. The second material, selected to be conductive, is laid across the whole wafer and is selectively removed from all areas except the plural orthognal rectangular shapes 21 across each gate area of each field effect semiconductor being manufactured in the wafer where a suspended diaphragm is desired.

Figure 4D:
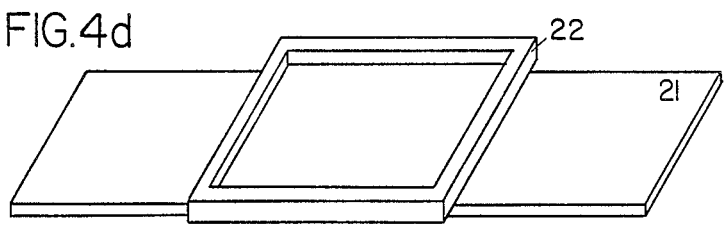

At this point in the fabrication process two of the four edges of the diaphragm remain unsealed (FIG. 4c). Reference is made to FIG. 4d. These edges could be sealed by depositing a relatively thick layer of some material (e.g., 0.5 um film of evaporated aluminum) over the entire wafer. The layer would then be patterned and etched, leaving only a frame of the aluminum 22 around the perimeter of the diaphragm. Such a process forms a hermetic seal for the diaphragm. Any of several other means for sealing could be used by those skilled in the art.

In FIGS. 4a, 4b, 4c and 4d the rectangular shapes of first and second material as shown relate to gate areas of only one of many gate controlled field effect semiconductor devices being fabricated simultaneously in a wafer of semiconductor material. The sheet of drawing on which FIG. 4 is placed could be thought of (figuratively) as the insulating layer on top of the plural field effect semiconductor devices in the wafer. FIG. 4a illustrates the manner in which the first material 20 in a rectangular shape is aligned with the gate over 30-31 of a single field effect semiconductor of many in a wafer. The drain 30 and source 31 are below the insulating layer (and are shown as dotted lines as below the sheet of drawing).

The pressure transducer described in this paper has three obvious advantages over other types of pressure sensors. First, all of the fabrication steps are performed on a full wafer of devices so that the eventual cost will be minimized. Second, by fabricating the diaphragm directly over the gate of the FET, the capacitive signal is converted in-situ into a low impedance electrical signal. No additional signal processing circuitry would be required on the chip although the fabrication process is compatible with the co-fabrication of additional circuitry on the chip if it is desired. The low impedance signal from the FET could be monitored using fairly long, non-shielded cables without adding noise to the signal. Third, the diaphragm can be fabricated from any of a large number of materials with different mechanical properties, giving an additional parameter in the design of a pressure sensor with a desired range and sensitivity.

The sensitivity of the device can be altered by changing thickness and lateral dimensions of the diaphragm as well as by changing the material of the diaphragm. The sensitivity should be at least as good as the usual capacitive pressure sensor and could be made higher since a large number of materials may be used for fabrication of the diaphragm.

Pursuant ot the teachings of the present invention the suspended gate material functioning as a diaphragm must be conductive but it need not be metal, for example, conductive polymers may be used. Moreover, the gate material may be layered material where only one layer or part of the layers are conductive.

The suspended gate field effect semiconductor devices would be typically fabricated on a 75 or 100mm round semiconductor wafer (e.g., a silicon wafer). The dimensions of an individual chip, on which would be fabricated at least one of the suspended gate field effect semiconductor devices, are usually on the order of 1 mm×1 mm. Thus, on a 75 mm diameter round wafer, an array of at least 50×50 (or 2500) individual chips could be simultaneously fabricated. Similarly, on a 100mm diameter wafer, an array of at least 75×75 (or 5,625) individual chips could be simultaneously fabricated. The entire fabrication process for the suspended gate field effect semiconductor device is performed simultaneously to all of the individual chips on the wafer while the individual chips remain in wafer form. Only after the fabrication process is complete is the large wafer separated into multiple individual chips.

Accordingly, it is to be understood that the embodiments of the invention herein described are merely illustrative of the application of the principles of the invention. Reference herein to details of the illustrated embodiments is not intended to limit the scope of the claims which themselves recite those features regarded as essential to the invention.

I claim:

1. A new and improved capacitive pressure transducer comprising:
    a. field effect solid state electronic device having a semiconductor gate area which includes the semiconductor material directly beneath the gate element, an insulating layer, a gate element which is insulated from the gate area and capacitively coupled to the gte area so as to allow the formation of an inversion layer or channel in the semiconductor gate area in response to changes in potential or movement of the gate element, and at least two distinctly doped areas in the semiconductor gate area which are in direct electrical contact with said inversion layer;
    b. said insulating layer being in direct contact with said semiconductor gate area;
    c. said gate element being hermetically sealed along its perimeter with the said insulating layer, but separated therefrom elsewhere forming a sealed gap;
    d. said gate element being made of conducting material and being constructed to move in response to pressure differentials on the two sides thereof so as to function as a diaphragm;
    e. said gate element also being a conductor so as to change the capacitance between the said gate element and the semiconductor of said field effect solid state device and cause any change in the output of said solid state electronic device to be a measure of the change of the pressure.

2. The field effect solid state electronic device of claim 1, wherein the at least two distinct doped areas in the semiconductor gate area are a drain element and a source element and the said gate element is constructed as a diaphragm by suspending it above the insulating layer bridging the areas of the insulating layer between the said drain and source elements of the solid state electronic device.

3. The field effect solid state electronic device of claim 1, wherein said gate element is constructed as a diaphragm by suspending it above the insulating layer adjacent to and bridging the said at least two distinctly doped areas of said solid state device.

4. A new and improved capacitive pressure transducer comprising of:
    a metal-oxide silicon field effect transistor having a p-type drain, a p-type source, an insulating layer covering and in direct contact with said n-type silicon substrate and said p-type drain and said p-type source, and conducting gate material suspended over said insulating layer and sealed on its perimeter with said insulating layer where said insulating layer bridges said n-type silicon substrate from the said p-type drain to said p-type source forming a sealed gap, the improvement comprises the suspension of the said conducting gate material above and hermetically sealed to the said insulating layer between the said p-type drain and said p-type source such that said conducting gate material functions as a diaphragm and as one surface of capacitor, so that the capacitance of the gate circuit of said transistor as it affects the drain current is a measure of the pressure.

5. A new and improved capacitive pressure transducer comprising of:
    a metal-oxide silicon field effect transistor having an n-type silicon substrate, a p-type drain, a p-type source, an insulating layer covering and in direct contact with said n-type silicon substrate and said p-type drain said p-type source, and conducting gate material suspened over said insulating layer and sealed on its perimeter with said insulating layer where said insulating layer bridges said n-type silicon substrate form the said p-type source forming a sealed gap where the improvement comprises the suspension of the said conducting gate material above and hermetically sealed to the said insulating layer between the said p-type drain and said p-type source such that said conducting gate material functions as a diaphragm and as one surface of a capacitor, so that the capacitance of the gate circuit of said transistor as it affects the drain current is a measure of the pressure.

* * * * *